(12) United States Patent
Choi

(10) Patent No.: US 12,342,700 B2
(45) Date of Patent: Jun. 24, 2025

(54) DISPLAY APPARATUS

(71) Applicant: Samsung Display Co., Ltd., Yongin-si (KR)

(72) Inventor: Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/604,324

(22) Filed: Mar. 13, 2024

(65) Prior Publication Data

US 2024/0324356 A1 Sep. 26, 2024

(30) Foreign Application Priority Data

Mar. 24, 2023 (KR) ........................ 10-2023-0039088
Jun. 23, 2023 (KR) ........................ 10-2023-0081339

(51) Int. Cl.
*G09G 3/3233* (2016.01)
*G09G 3/00* (2006.01)
*H10K 59/131* (2023.01)

(52) U.S. Cl.
CPC ........... *H10K 59/131* (2023.02); *G09G 3/035* (2020.08); *G09G 3/3233* (2013.01); *G09G 2300/0408* (2013.01); *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2310/0281* (2013.01)

(58) Field of Classification Search
CPC .... H10K 59/131; G09G 3/035; G09G 3/3233; G09G 2300/0408; G09G 2300/0426; G09G 2300/0452; G09G 2300/0819; G09G 2300/0842; G09G 2300/0861; G09G 2310/0281
See application file for complete search history.

(56) References Cited

U.S. PATENT DOCUMENTS

| 9,760,125 | B2 | 9/2017 | Kim et al. |
| 10,256,165 | B2 | 4/2019 | Chung et al. |
| 10,845,659 | B2 * | 11/2020 | Xian ............... G02F 1/1309 |
| 10,868,096 | B2 | 12/2020 | Park et al. |

(Continued)

FOREIGN PATENT DOCUMENTS

| JP | 2021-2009 A | 1/2021 |
| KR | 10-1482629 B1 | 1/2015 |

(Continued)

*Primary Examiner* — Antonio Xavier
(74) *Attorney, Agent, or Firm* — Womble Bond Dickinson (US) LLP

(57) ABSTRACT

A display apparatus includes: a substrate including: a display area; and a peripheral area including: a first peripheral including a first bending area; and a second peripheral area including a second bending area; a pixel in the display area and including a display element; a data driving circuit in the first peripheral area; a gate driving circuit in the second peripheral area; a data line electrically connected to the data driving circuit and the pixel; a gate line electrically connected to the gate driving circuit and the pixel; and a gate connection line having one side connected to the gate driving circuit, and another side connected to the gate line. The first peripheral area and the second peripheral area are opposite to each other with the display area therebetween.

18 Claims, 11 Drawing Sheets

(56) References Cited

U.S. PATENT DOCUMENTS

| | | | |
|---|---|---|---|
| 11,177,335 B2 | 11/2021 | Park et al. | |
| 2017/0047038 A1* | 2/2017 | Noma | G02F 1/1368 |
| 2020/0393936 A1* | 12/2020 | Bok | G06F 3/0446 |
| 2021/0337691 A1* | 10/2021 | Lee | H05K 5/04 |
| 2022/0066507 A1* | 3/2022 | Jin | G06F 3/041 |
| 2022/0102455 A1 | 3/2022 | Kim et al. | |
| 2022/0180785 A1 | 6/2022 | Shim et al. | |
| 2022/0253111 A1 | 8/2022 | Asada et al. | |
| 2022/0309974 A1 | 9/2022 | Park et al. | |
| 2023/0052358 A1 | 2/2023 | Song et al. | |
| 2024/0048647 A1* | 2/2024 | Hu | H01L 23/544 |

FOREIGN PATENT DOCUMENTS

| | | |
|---|---|---|
| KR | 10-2018-0027704 A | 3/2018 |
| KR | 10-2076666 B1 | 2/2020 |
| KR | 10-2020-0113055 A | 10/2020 |
| KR | 10-2021-0084733 A | 7/2021 |
| KR | 10-2022-0080456 A | 6/2022 |

\* cited by examiner

DISPLAY APPARATUS

CROSS-REFERENCE TO RELATED APPLICATIONS

The present application claims priority to and the benefit of Korean Patent Application No. 10-2023-0039088, filed on Mar. 24, 2023, and Korean Patent Application No. 10-2023-0081339, filed on Jun. 23, 2023, in the Korean Intellectual Property Office, the entire disclosures of all of which are incorporated by reference herein.

BACKGROUND

1. Field

Aspects of one or more embodiments of the present disclosure relate to a display apparatus having an extended display area for displaying an image.

2. Description of Related Art

Display apparatuses visually display data. Such display apparatuses typically include a substrate partitioned into a display area, and a peripheral area around the display area. In the display area, a scan line and a data line are insulated from each other, and a plurality of pixels connected to the scan line and the data line are arranged. In addition, a transistor and a pixel electrode, which is electrically connected to the transistor, are provided in the display area for each of the pixels. Further, an opposite electrode commonly provided for the pixels may be provided in the display area, and various wires configured to transmit electrical signals to the display area, a scan driver, a data driver, a controller, and the like may be provided in the peripheral area.

Uses of such display apparatuses are diversifying. Accordingly, research is actively being conducted on ways to reduce or efficiently use the peripheral area of the display apparatuses.

The above information disclosed in this Background section is for enhancement of understanding of the background of the present disclosure, and therefore, it may contain information that does not constitute prior art.

SUMMARY

One or more embodiments of the present disclosure are directed to a display apparatus having a reduced peripheral area, and improved (e.g., excellent) display quality. However, the aspects and features of the present disclosure are not limited thereto.

Additional aspects and features will be set forth, in part, in the description that follows, and in part, will be apparent from the description, or may be learned by practicing one or more of the presented embodiments of the present disclosure.

According to one or more embodiments of the present disclosure, a display apparatus includes: a substrate including: a display area; and a peripheral area including: a first peripheral including a first bending area; and a second peripheral area including a second bending area; a pixel in the display area and including a display element; a data driving circuit in the first peripheral area; a gate driving circuit in the second peripheral area; a data line electrically connected to the data driving circuit and the pixel; a gate line electrically connected to the gate driving circuit and the pixel; and a gate connection line having one side connected to the gate driving circuit, and another side connected to the gate line. The first peripheral area and the second peripheral area are opposite to each other with the display area therebetween.

In an embodiment, the gate connection line may overlap with the display area.

In an embodiment, the display apparatus may further include a display circuit board attached to the first peripheral area or the second peripheral area.

In an embodiment, the gate line may extend in a first direction, and the data line and the gate connection line may extend in a second direction crossing the first direction.

In an embodiment, the first bending area may be between the display area and the data driving circuit, and the second bending area may be between the display area and the gate driving circuit.

In an embodiment, the display apparatus may further include an internal gate driving circuit in the display area.

In an embodiment, the internal gate driving circuit may be configured to transmit an emission control signal to the pixel.

In an embodiment, the display apparatus may further include: a first insulating layer in the first peripheral area of the substrate, and including a groove surrounding the data driving circuit; and a second insulating layer having at least a portion filled in the groove.

In an embodiment, the display apparatus may further include: a first insulating layer in the second peripheral area of the substrate, and including a groove surrounding the gate driving circuit; and a second insulating layer having at least a portion filled in the groove.

In an embodiment, the display area may include a first display area, and a second display area at least partially surrounded by the first display area, and the gate driving circuit may at least partially surround a portion of the second peripheral area that overlaps with the second display area in a plan view.

According to one or more embodiments of the present disclosure, a display apparatus includes: a substrate including: a display area; and a peripheral area including: a first peripheral area including a first bending area; and a second peripheral area opposite to the first peripheral area with the display area between the first peripheral area and the second peripheral area; a pixel in the display area and including a display element; a data driving circuit in the first peripheral area; a gate driving circuit in the second peripheral area; a gate line electrically connected to the gate driving circuit, and extending in a first direction to be connected to the pixel; and a data line electrically connected to the data driving circuit, and extending in a second direction crossing the first direction to be connected to the pixel.

In an embodiment, the second peripheral area may include a second bending area facing the first bending area in the second direction.

In an embodiment, the first bending area may be between the display area and the data driving circuit, and the second bending area may be between the display area and the gate driving circuit.

In an embodiment, the display apparatus may further include a gate connection line extending in the second direction, the gate connection line having one side connected to the gate driving circuit, and another side connected to the gate line.

In an embodiment, the display apparatus may further include a display circuit board attached to the first peripheral area or the second peripheral area.

In an embodiment, the display apparatus may further include an internal gate driving circuit in the display area and extending in the second direction.

In an embodiment, the display apparatus may further include a first insulating layer on the substrate, and including a groove surrounding the gate driving circuit or the data driving circuit.

In an embodiment, the display apparatus may further include a second insulating layer having at least a portion filled in the groove.

In an embodiment, the display area may include a first display area, and a second display area at least partially surrounded by the first display area, and the display apparatus may further include a component under the substrate to correspond to the second display area.

In an embodiment, the gate driving circuit may at least partially surround a portion of the second peripheral area corresponding to the component in a plan view.

The above, general, and specific embodiments may be implemented by using a system, a method, a computer program, or any suitable combinations thereof.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
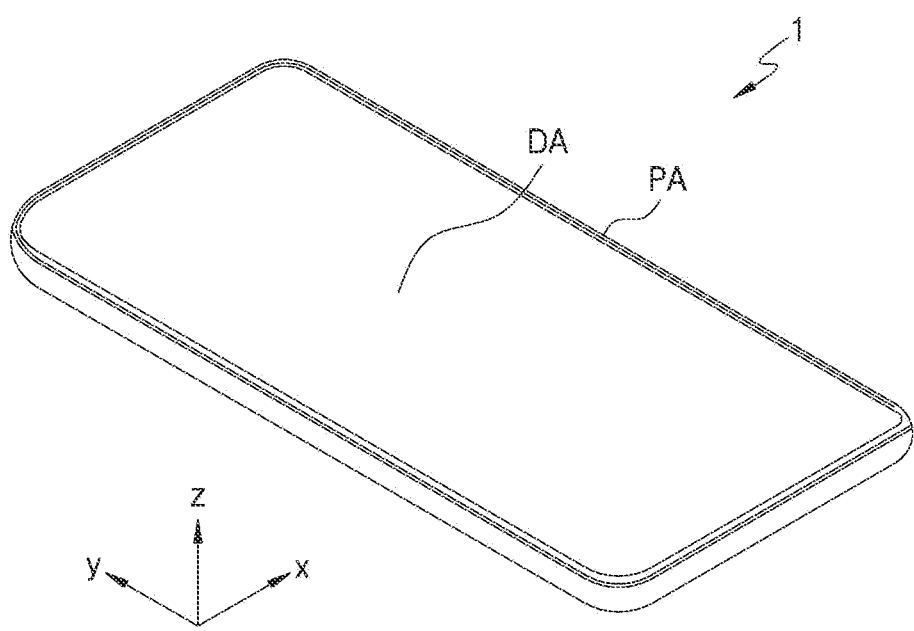
FIG. 1 is a schematic perspective view of a display apparatus according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described.

Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
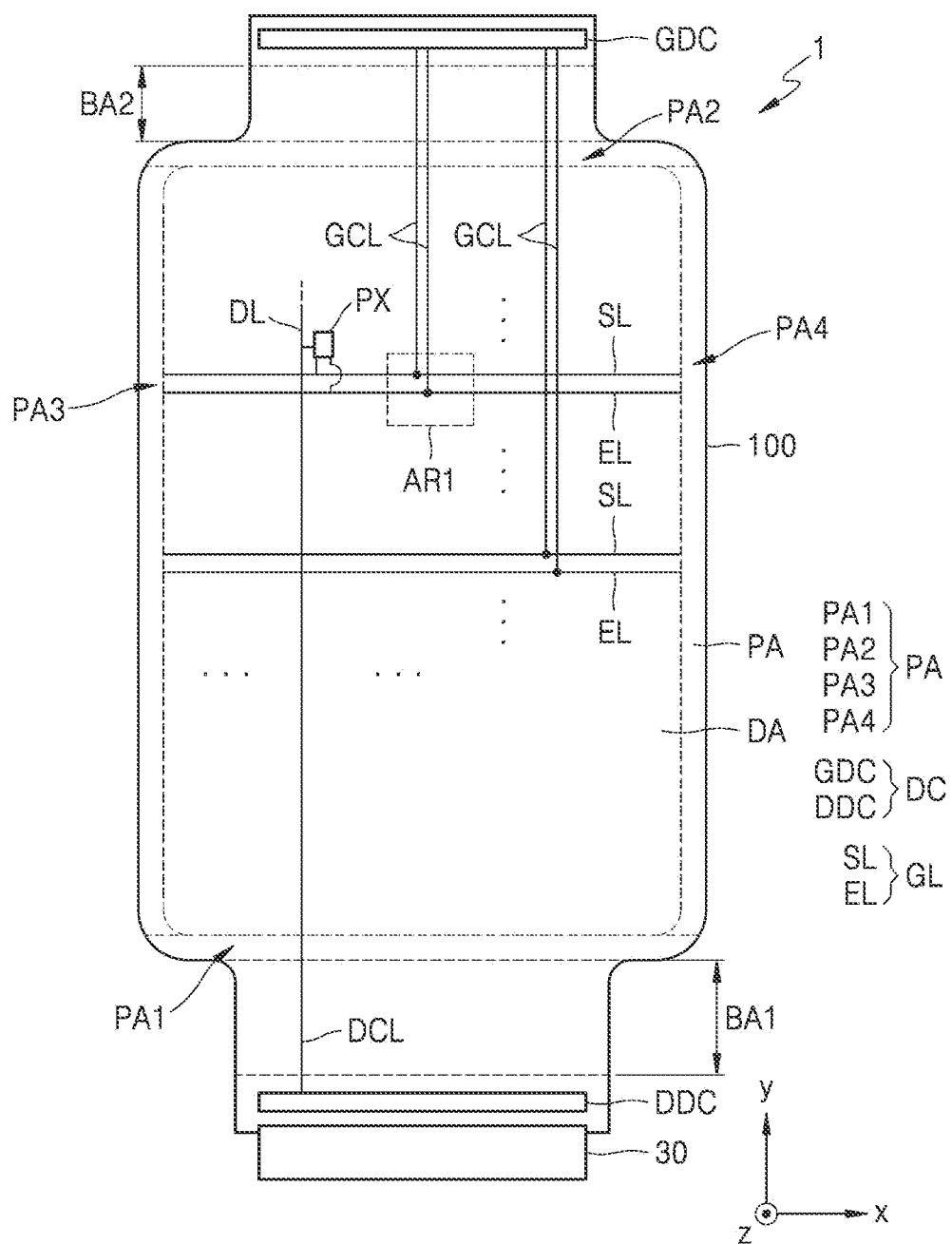
FIG. 2 is a schematic plan view of a display apparatus according to an embodiment.
Figure 3A:
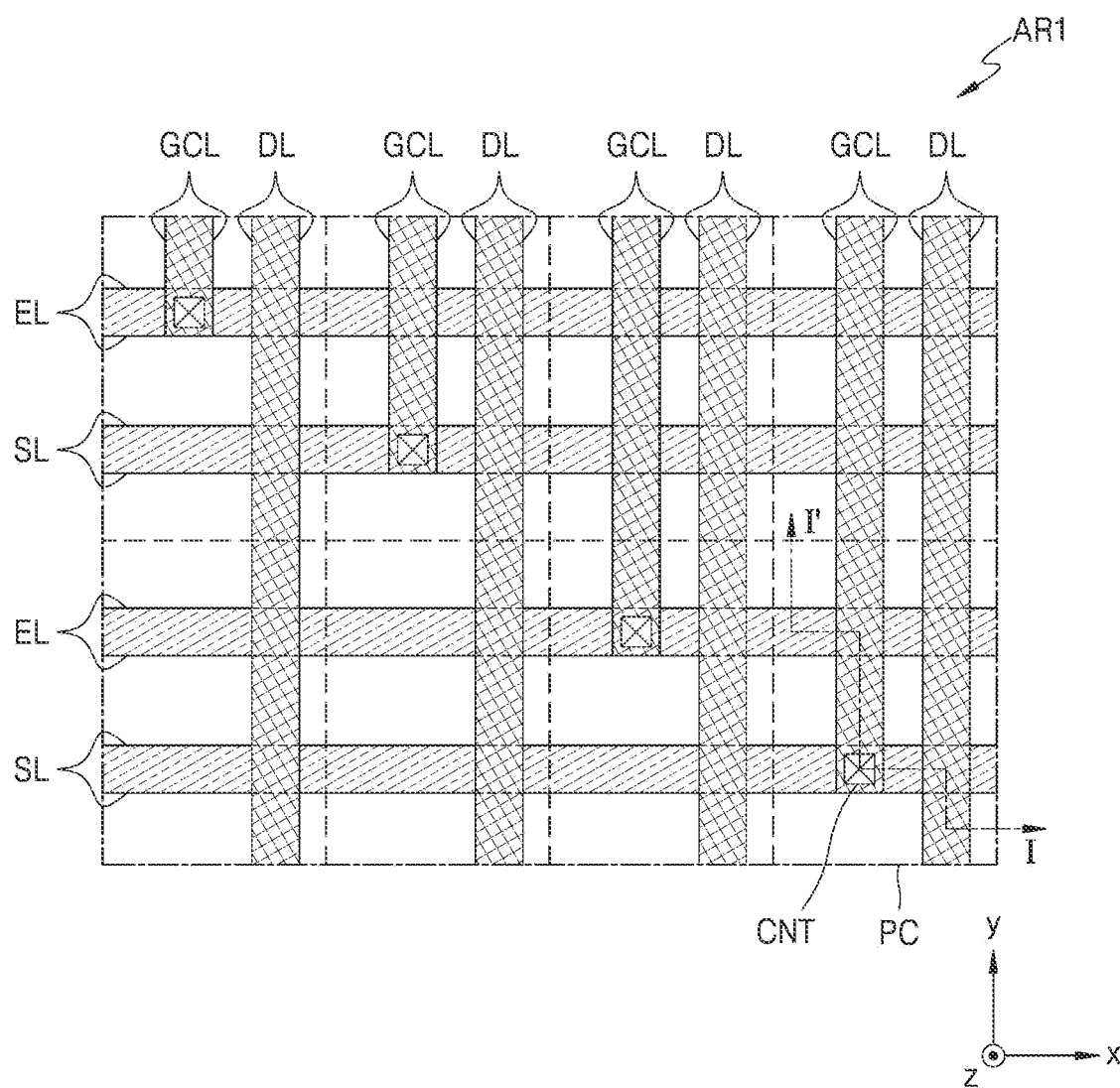
FIG. 3A is an enlarged plan view of an area of FIG. 2.
Figure 3B:
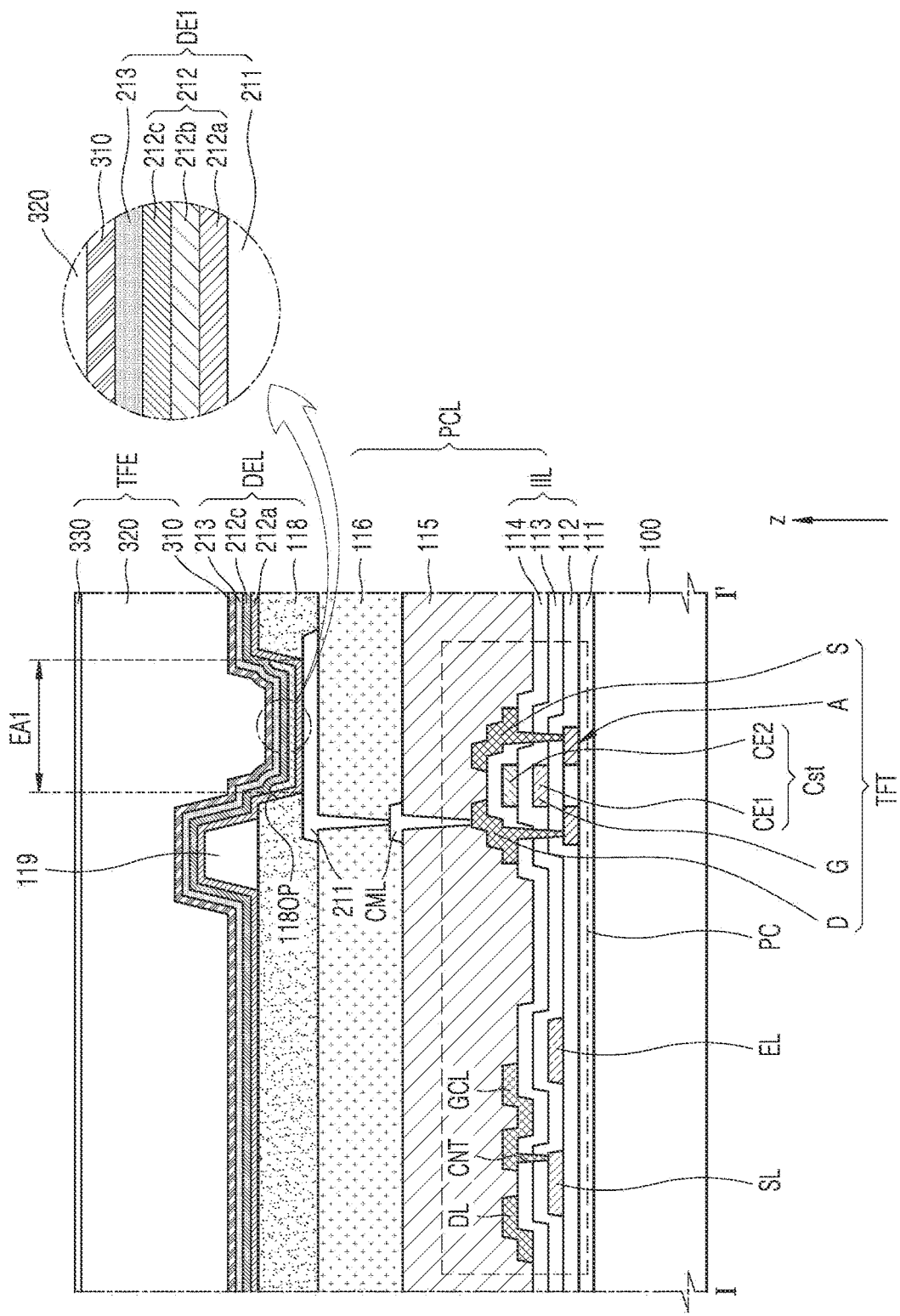
FIG. 3B is a cross-sectional view taken along the line I-I' of FIG. 3A, and illustrates a data line and a pixel circuit.

FIG. 1 is a schematic perspective view of a display apparatus 1 according to an embodiment. FIG. 2 is a schematic plan view of the display apparatus 1 according to an embodiment. FIG. 3A is an enlarged plan view of the area AR1 of FIG. 2. FIG. 3B is a cross-sectional view taken along the line I-I' of FIG. 3A, and illustrates a data line DL and a pixel circuit PC.

Referring to FIG. 1, the display apparatus 1 is a device for displaying a moving image or a still image, and may be used as the display screen of various suitable portable electronic devices, such as a mobile phone, a smartphone, a tablet personal computer (PC), a mobile communication terminal, an electronic notebook, an e-book, a portable multimedia player (PMP), a navigation system, and an ultra-mobile PC (UMPC), as well as for various suitable products, such as a television, a notebook computer, a monitor, a billboard, and the Internet of things (IoT) devices.

The display apparatus 1 may be used in various suitable wearable devices, such as a smartwatch, a watch phone, a glasses-type display, and a head-mounted display (HMD). In addition, the display apparatus 1 may be used as a car's instrument panel, a center information display (CID) placed on a car's center fascia or dashboard, a room mirror display replacing a car's side mirror, or a display placed on the back of a car's front seat as entertainment for passengers in the car's rear seat.

The display apparatus 1 may have shorter sides extending in a first direction (e.g., the x direction), and longer sides extending in a second direction (e.g., the y direction). In this regard, the first direction and the second direction may cross each other. For example, the first direction and the second direction may define an acute angle. As another example, the first direction and the second direction may define an obtuse angle or a right angle. A case where the first direction (e.g., the x direction) and the second direction (e.g., the y direction) define a right angle will be mainly described in more detail hereinafter.

As another example, the length of the sides of the display apparatus 1 extending in the first direction (e.g., the x direction) may be equal to or substantially equal to the length of the sides of the display apparatus 1 extending in the second direction (e.g., the y direction). As another example, the display apparatus 1 may have longer sides extending in the first direction (e.g., the x direction), and shorter sides extending in the second direction (e.g., the y direction).

The corners between the shorter sides extending in the first direction (e.g., the x direction) and the longer sides extending in the second direction (e.g., the y direction) may be rounded to have a suitable curvature. As another example, the corners may have right angles.

In FIG. 2, a plan view of the display apparatus 1 is illustrated, in which the shape of a side area (e.g., a bending area) of the display apparatus 1 is not yet bent. In other words, FIG. 2 illustrates a plan view in which a first bending area BA1 and a second bending area BA2 of the display apparatus 1 are in unbent states.

The display apparatus 1 may include a display element. For example, the display apparatus 1 may include one from among an organic light-emitting display panel that uses an organic light-emitting diode including an organic emission layer, a micro light-emitting diode (LED) display panel that uses a micro LED, a quantum-dot light-emitting display panel that uses a quantum-dot light-emitting diode including a quantum-dot emission layer, and/or an inorganic light-emitting display panel that uses an inorganic light-emitting diode including an inorganic semiconductor. For convenience, case where the display apparatus 1 is an organic light-emitting display apparatus that uses an organic light-emitting diode as a display element will be mainly described in more detail hereinafter.

Referring to FIG. 2, the display apparatus 1 may include a display area DA and a peripheral area PA. The display area DA is an area where a plurality of pixels PX for displaying an image is arranged, and the peripheral area PA may at least partially surround (e.g., around a periphery of) the display area DA.

The display apparatus 1 may include a substrate 100, and multiple layers (e.g., multi-layers) disposed on the substrate 100. In this regard, the display area DA and the peripheral area PA may be defined in the substrate 100 and/or the multi-layers. In other words, the substrate 100 and/or the multi-layers may be understood to include the display area DA and the peripheral area PA.

Each of the pixels PX may include sub-pixels, and each of the sub-pixels may emit light of a desired color (e.g., a certain or predetermined color) by an organic light-emitting diode as the display element. Each organic light-emitting diode may emit, for example, red, green, or blue light. Each organic light-emitting diode may be connected to a pixel circuit including a thin-film transistor and a storage capacitor.

The peripheral area PA is an area where no image is provided, and may be a non-display area. The peripheral area PA may include a first peripheral area PA1, a second peripheral area PA2, a third peripheral area PA3, and a fourth peripheral area PA4, which are partitioned based on the display area DA.

In an embodiment, the first peripheral area PA1 may be an area located at a lower or substantially lower end portion of the display area DA. The second peripheral area PA2 may be an area located at an upper or substantially upper end portion of the display area DA. The third peripheral area PA3 may be an area located to the left or substantially to the left of the display area DA. The fourth peripheral area PA4 may be an area located to the right or substantially to the right of the display area DA. The first peripheral area PA1 and the second peripheral area PA2 may be opposite to or face each other in a second direction (e.g., the y direction), and the third peripheral area PA3 and the fourth peripheral area PA4 may be opposite to or face each other in a first direction (e.g., the x direction).

The peripheral area PA may include a bending area BA. The bending area BA may include the first bending area BA1 and the second bending area BA2.

The first bending area BA1 may be arranged in the peripheral area PA extending from the lower end portion of the display area DA in the second direction (e.g., the −y direction). For example, the first bending area BA1 may be arranged in the first peripheral area PA1. The second bending area BA2 may be arranged in the peripheral area PA extending from the upper end portion of the display area DA in the second direction (e.g., the y direction). The second bending area BA2 may be arranged in the second peripheral area PA2. When a front side (e.g., a front surface) of the display apparatus 1 is viewed while the bending area BA is bent, a portion of the peripheral area PA may not be visually recognized by a user.

A driving circuit DC configured to provide an electrical signal to each pixel PX through a corresponding signal line, a voltage wire for providing a voltage, and the like may be arranged in the peripheral area PA. The driving circuit DC may include a data driving circuit DDC and a gate driving circuit GDC.

The data driving circuit DDC may be arranged on one side of the peripheral area PA. As shown in FIG. 2, the data driving circuit DDC may be arranged in a portion of the peripheral area PA that corresponds to a lower end portion of the display apparatus 1. The data driving circuit DDC may be arranged in the first peripheral area PA1.

The data driving circuit DDC may be configured to provide a data signal to each pixel PX through a corresponding data line DL. The data line DL may extend in the second direction (e.g., the y direction), and may be connected to the pixels PX located in the same column as each other.

The data line DL may be connected to the data driving circuit DDC through a data connection line DCL. One side of the data connection line DCL may be connected to the data driving circuit DDC, and another side (e.g., an opposite side) thereof may be connected to the data line DL. The data connection line DCL may be arranged in the peripheral area PA. For example, the data connection line DCL may be arranged in correspondence with the first peripheral area PA1.

The gate driving circuit GDC may be configured to transmit a gate signal to each pixel PX through a corresponding gate line GL. The gate line GL may extend in the first direction (e.g., the x direction), and may be connected to the pixels PX located in the same row as each other. The gate line GL may include a scan line SL and an emission control line EL, and the gate signal may include a scan signal and an emission control signal. The gate driving circuit GDC may include a scan driving circuit, and may be configured to transmit a scan signal to each pixel PX through the corresponding scan line SL. In addition, the gate driving circuit GDC may also include an emission control driving circuit, and may be configured to provide an emission control signal to each pixel PX through a corresponding emission control line EL.

The gate driving circuit GDC may be arranged on one side of the peripheral area PA. The gate driving circuit GDC may be arranged opposite to the data driving circuit DDC. As shown in FIG. 2, the gate driving circuit GDC may be arranged in a portion of the peripheral area PA that corresponds to an upper end portion of the display apparatus 1. The gate driving circuit GDC may be arranged in the second peripheral area PA2.

The gate line GL may be connected to the gate driving circuit GDC through a gate connection line GCL. The gate connection line GCL may extend in the second direction (e.g., the y direction) crossing the first direction (e.g., the x direction). One side of the gate connection line GCL may be connected to the gate driving circuit GDC, and another side (e.g., an opposite side) thereof may be connected to the gate line GL. The gate driving circuit GDC may be configured to transmit a gate signal to each pixel PX through a corresponding gate connection line GCL and the corresponding gate line GL. The gate connection line GCL may overlap with the display area DA.

According to an embodiment, the data driving circuit DDC and the gate driving circuit GDC may be arranged on different sides of the peripheral area PA, respectively. The data driving circuit DDC and the gate driving circuit GDC may face each other with the display area DA therebetween. As shown in FIG. 2, the data driving circuit DDC may be arranged in the first peripheral area PA1, and the gate driving circuit GDC may be arranged in the second peripheral area PA2.

In a comparative example (e.g., a first comparative example), a data driving circuit may be arranged in a lower end portion of a display apparatus, and a gate driving circuit may be arranged on a left side and/or a right side of the display apparatus. In this case, the area of a dead space on the left and/or right sides of the display apparatus may be increased according to the arrangement of the gate driving circuit.

In another comparative example (e.g., a second comparative example), a gate driving circuit may be arranged on one side of a peripheral area together with a data driving circuit. For example, the data driving circuit and the gate driving circuit may both be arranged in a lower end portion of a display apparatus. In this case, because wires for transmitting various signals from the driving circuits to a display area may be concentrated on the lower end portion, the difficulty of a wiring design may be increased, or interference between the wires may occur. In more detail, as a pixel circuit becomes more complex to implement a high-resolution display apparatus, the number of wires that are used may increase, which may cause difficulty in the wiring design.

In comparison, according to one or more embodiments of the present disclosure, the data driving circuit DDC may be arranged in the lower end portion of the display apparatus 1, and the gate driving circuit GDC may be arranged in the upper end portion of the display apparatus 1. Accordingly, the area of the dead space on the left side and/or the right side of the display apparatus 1 may be decreased. As described above, the second bending area BA2 in the upper end portion of the display apparatus 1 may be bent, and thus, when a front side (e.g., a front surface) of the display apparatus 1 is viewed (e.g., in a plan view), an area of the second peripheral area PA2 for arranging the gate driving circuit GDC may not be visible to a user.

In addition, the data driving circuit DDC and the gate driving circuit GDC may face each other with the display area DA therebetween, and thus, compared to the case where the gate driving circuit GDC is arranged on one side of the display apparatus 1 together with the data driving circuit DDC, a concentration of wires may be decreased, thus facilitating the wiring design.

Still referring to FIG. 2, the peripheral area PA may include a pad portion, which is an area to which an electronic device or a printed circuit board may be electrically connected. The pad portion may be exposed without being covered by an insulating layer, and may be electrically connected to a display circuit board 30. The display circuit board 30 may be a flexible printed circuit board. The display circuit board 30 may electrically connect a controller to the pad portion, and may be configured to supply a signal or power received from the controller. The display circuit board 30 may be arranged in the first peripheral area PA1 and/or the second peripheral area PA2 of the display apparatus 1. In some embodiments, the gate driving circuit GDC and/or the data driving circuit DDC may be arranged on the display circuit board 30.

Referring to FIG. 3A, some of a plurality of pixel circuits PC arranged along a row direction (e.g., the x direction) and a column direction (e.g., the y direction) are shown. Each of the scan line SL and the emission control line EL may extend in the first direction (e.g., the x direction), and the data line DL may extend in the second direction (e.g., the y direction). The gate connection line GCL connecting each of the corresponding scan line SL and/or the corresponding emission control line EL to the gate driving circuit GDC may extend in the second direction (e.g., the y direction). The gate connection line GCL may extend in the same direction as that of the data line DL.

In an embodiment, as shown in FIG. 3A, one gate connection line GCL may overlap with one pixel circuit PC. The pixel circuits PC arranged in the same column as each other may be overlapped with the same gate connection line GCL. As another example, two or more gate connection lines GCL may overlap with one pixel circuit PC. In other words, the pixel circuits PC arranged in the same column as each other may be overlapped with two or more gate connection lines GCL.

In an embodiment, the gate connection line GCL may be arranged on a different layer from that of the scan line SL and the emission control line EL. Referring to FIG. 3B, insulating layers, such as a first gate insulating layer 113 and a second gate insulating layer 114, may be disposed between the gate connection line GCL and the scan line SL, and between the gate connection line GCL and the emission control line EL. In this case, the gate connection line GCL may be connected to the corresponding scan line SL and/or the corresponding emission control line EL through a contact hole CNT in (e.g., penetrating) the first gate insulating layer 113 and the second gate insulating layer 114.

FIG. 3B shows the gate connection line GCL disposed on the second gate insulating layer 114. However, as another example, the gate connection line GCL may be disposed on the first gate insulating layer 113. The first gate insulating layer 113 may be disposed between the gate connection line GCL and the scan line SL, and between the gate connection line GCL and the emission control line EL.

The contact hole CNT connecting the scan line SL and/or the emission control line EL to the gate connection line GCL may be defined in at least one pixel circuit PC from among the pixel circuits PC arranged in the same row as each other. As an example, two or more pixel circuits PC from among the plurality of pixel circuits PC arranged in the same row as each other may be connected to the gate connection line GCL through the contact hole CNT.

In an embodiment, the gate connection line GCL may be arranged at (e.g., in or on) the same layer as that of the data line DL. Referring to FIG. 3B, the gate connection line GCL and the data line DL may be disposed on an interlayer insulating layer 114.

The multi-layers stacked on a display apparatus will be described in more detail hereinafter with reference to FIG. 3B.

Referring to FIG. 3B, the display apparatus may include the substrate 100, a buffer layer 111, a pixel circuit layer PCL, a display element layer DEL, and a thin-film encapsulation layer TFE.

The substrate 100 may include glass, or may include a polymer resin, such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, and/or bendable. The substrate 100 may have a multi-layered structure including a base layer and a barrier layer, and the base layer may include the polymer resin.

The buffer layer 111 may include an inorganic insulating material, such as silicon nitride, silicon oxynitride, and/or silicon oxide, and may have a single-layer or multi-layered structure including one or more of the above-described inorganic insulating materials.

The pixel circuit layer PCL may be disposed on the buffer layer 111. The pixel circuit layer PCL may include a thin-film transistor TFT included in the pixel circuit PC, and an inorganic insulating layer IIL, a first planarization layer 115, and a second planarization layer 116, which may be disposed below and/or over the elements of the thin-film transistor TFT. The inorganic insulating layer IIL may include the first gate insulating layer 112, the second gate insulating layer 113, and the interlayer insulating layer 114.

The thin-film transistor TFT may include a semiconductor layer A, and the semiconductor layer A may include polysilicon. As another example, the semiconductor layer A may include amorphous silicon, an oxide semiconductor, or an organic semiconductor. The semiconductor layer A may include a channel region, and a drain region and a source region arranged on opposite sides of the channel region, respectively. A gate electrode G may overlap with the channel region.

The gate electrode G may include a low-resistance metal material. The gate electrode G may include a conductive material including molybdenum (Mo), aluminum (Al), copper (Cu), titanium (Ti), and/or the like, and may have a multi-layered or single-layer structure including one or more of the above-described materials. In an embodiment, the scan line SL and the emission control line EL may be arranged at (e.g., in or on) the same layer as that of the gate electrode G. The scan line SL and the emission control line EL may be disposed on the first gate insulating layer 112.

The first gate insulating layer 112 between the semiconductor layer A and the gate electrode G may include an inorganic insulating material, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may cover the gate electrode G. Like the first gate insulating layer 112, the second gate insulating layer 113 may include an inorganic insulating material, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An upper electrode CE2 of a storage capacitor Cst may be disposed on the second gate insulating layer 113. The upper electrode CE2 may overlap with the gate electrode G disposed under the upper electrode CE2. In this regard, the gate electrode G and the upper electrode CE2 overlapping with each other with the second gate insulating layer 113 therebetween may constitute the storage capacitor Cst of the pixel circuit PC. In other words, the gate electrode G may serve as a lower electrode CE1 of the storage capacitor Cst. As such, the storage capacitor Cst and the thin-film transistor TFT may overlap with each other. In some embodiments, the storage capacitor Cst may not overlap with the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W) and/or copper (Cu), and may have a single-layer or multi-layered structure including one or more of the above-described materials.

The interlayer insulating layer 114 may cover the upper electrode CE2. The interlayer insulating layer 114 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may have a single-layer or multi-layered structure including one or more of the above-described inorganic insulating materials.

The data line DL, the gate connection line GCL, a drain electrode D, and a source electrode S may each be disposed on the interlayer insulating layer 114. The data line DL, the gate connection line GCL, the drain electrode D, and the source electrode S may include a highly conductive material. The data line DL, the gate connection line GCL, the drain electrode D, and the source electrode S may include a conductive material including molybdenum (Mo), aluminum (Al), copper (Cu), titanium (Ti), and/or the like, and may have a multi-layered or single-layer structure including one or more of the above-described materials. In an embodiment, the data line DL, the gate connection line GCL, the drain electrode D, and the source electrode S may have a multi-layered structure of Ti/Al/Ti.

The first planarization layer 115 may cover the data line DL, the gate connection line GCL, the drain electrode D, and the source electrode S. The first planarization layer 115 may include an organic insulating layer. The first planarization layer 115 may include an organic insulating material, such as a general commercial polymer (e.g., polymethylmethacrylate (PMMA) or polystyrene (PS)), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a suitable blend thereof.

A connection electrode CML may be disposed on the first planarization layer 115. In this regard, the connection electrode CML may be connected to the drain electrode D or the source electrode S through a contact hole in (e.g., penetrating) the first planarization layer 115. The connection electrode CML may include a highly conductive material. The connection electrode CML may include a conductive material including molybdenum (Mo), aluminum (Al), copper (Cu), titanium (Ti), and/or the like, and may have a multi-layered or single-layer structure including one or more of the above-described materials. In an embodiment, the connection electrode CML may have a multi-layered structure of Ti/Al/Ti.

The second planarization layer 116 may cover the connection electrode CML. The second planarization layer 116 may include an organic insulating layer. The second planarization layer 116 may include an organic insulating material, such as a general commercial polymer (e.g., PMMA or PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a suitable blend thereof.

The display element layer DEL may be disposed on the pixel circuit layer PCL. The display element layer DEL may include a first display element DE1. The first display element DE1 may be an organic light-emitting diode (OLED). A pixel electrode 211 of the first display element DE1 may be electrically connected to the connection electrode CML through a contact hole in (e.g., penetrating) the second planarization layer 116.

The pixel electrode 211 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 211 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or a suitable compound thereof. In another embodiment, the pixel electrode 211 may further include a layer including ITO, IZO, ZnO, or $In_2O_3$ over/under the reflection layer.

A pixel-defining layer 118 including an opening 118OP exposing a central portion of the pixel electrode 211 may be disposed on the pixel electrode 211. The pixel-defining layer 118 may include an organic insulating material and/or an inorganic insulating material. The opening 118OP may define an emission area (e.g., the emission area EA1) for light emitted from the first display element DE1. For example, a width of the opening 118OP may correspond to a width of the emission area EA1 of the first display element DE1.

A spacer 119 may be disposed on the pixel-defining layer 118. The spacer 119 may be used to prevent or substantially prevent damage or destruction of the substrate 100 in a method of manufacturing a display apparatus. A mask sheet may be used to manufacture the display panel. In this regard, a defect may be prevented or substantially prevented, such as when a portion of the substrate 100 is damaged or destroyed by the mask sheet if the mask sheet enters the opening 118OP of the pixel-defining layer 118 or comes into close contact with the pixel-defining layer 118 when a deposition material is deposited on the substrate 100.

The spacer 119 may include an organic insulating material, such as polyimide. As another example, the spacer 119 may include an inorganic insulating material, such as silicon nitride or silicon oxide, or may include an organic insulating material and an inorganic insulating material.

In an embodiment, the spacer 119 may include a different material from that of the pixel-defining layer 118. As another example, in another embodiment, the spacer 119 may include the same material as that of the pixel-defining layer 118, and in this case, the pixel-defining layer 118 and the spacer 119 may be formed together in a mask process using a halftone mask or the like.

An intermediate layer 212 may be disposed on the pixel-defining layer 118. The intermediate layer 212 may include an emission layer 212b arranged in the opening 118OP of the pixel-defining layer 118. The emission layer 212b may include a high-molecular weight or low-molecular weight organic material for emitting light of a certain or predetermined color.

A first functional layer 212a and a second functional layer 212c may be disposed under and over the emission layer 212b, respectively. The first functional layer 212a may include, for example, a hole transport layer (HTL), or an HTL and a hole injection layer (HIL). The second functional layer 212c is an element disposed over the emission layer 212b, and may be optional (e.g., may be selectively formed). The second functional layer 212c may include an electron transport layer (ETL) and/or an electron injection layer (EIL). Like an opposite electrode 213 described in more detail below, the first functional layer 212a and/or the second functional layer 212c may be a common layer entirely or substantially entirely covering the substrate 100.

The opposite electrode 213 may include a conductive material having a low work function. For example, the opposite electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a suitable alloy thereof. As another example, the opposite electrode 213 may further include a layer, such as ITO, IZO, ZnO, or $In_2O_3$, on the (semi) transparent layer including one or more of the above-described materials.

In some embodiments, a capping layer may be further disposed on the opposite electrode 213. The capping layer may include lithium fluoride (LiF), an inorganic material, and/or an organic material.

The thin-film encapsulation layer TFE may be disposed on the opposite electrode 213. In an embodiment, the thin-film encapsulation layer TFE may include at least one inorganic encapsulation layer, and at least one organic encapsulation layer. 3B shows an embodiment in which the thin-film encapsulation layer TFE includes a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may include one or more inorganic materials from among aluminum oxide, titanium oxide, tantalum oxide, hafnium oxide, zinc oxide, silicon oxide, silicon nitride, and/or silicon oxynitride. The organic encapsulation layer 320 may include a polymer-based material. Examples of the polymer-based material may include an acryl-based resin, an epoxy-based resin, polyimide, and polyethylene. In an embodiment, the organic encapsulation layer 320 may include acrylate.

In some embodiments, a touch electrode layer may be further disposed on the thin-film encapsulation layer TFE, and an optical functional layer may be further disposed on the touch electrode layer. The touch electrode layer may obtain coordinate information according to an external input, for example, such as a touch event. The optical functional layer may reduce a reflectance of light (e.g., external light) that may be externally incident toward the display apparatus, and/or may improve color purity of light emitted from the display apparatus. In an embodiment, the optical functional layer may include a phase retarder and/or a polarizer. The phase retarder may be of a film kind or a liquid crystal coating kind, and may include a $\lambda/2$ phase retarder and/or a $\lambda/4$ phase retarder. The polarizer may also be of a film kind or a liquid crystal coating kind. The film kind may include an elongated synthetic resin film, and the liquid crystal coating kind may include liquid crystals arranged in a suitable arrangement (e.g., a certain or predetermined arrangement). The phase retarder and the polarizer may further include a protection film.

In another embodiment, the optical functional layer may include a black matrix and color filters. The color filters may be arranged according to (e.g., by taking into account) the colors of light emitted from the pixels PX of the display apparatus, respectively. Each of the color filters may include a pigment or dye of a red, green, or blue color. As another example, each of the color filters may further include quantum dots, in addition to the pigment or dye. As another example, some of the color filters may not include the pigment or dye, and may include scattered particles, such as titanium oxide.

In another embodiment, the optical functional layer may include a destructive interference structure. The destructive interference structure may include a first reflection layer and a second reflection layer arranged at (e.g., in or on) different layers, respectively. First reflected light and second reflected light reflected by the first reflection layer and the second reflection layer, respectively, may destructively interfere with each other, and thus, the reflectance of the external light may be reduced.

An adhesive member may be disposed between the touch electrode layer and the optical functional layer. As the adhesive member, a generally known adhesive may be employed without any particular limitation. For example, the adhesive member may be a pressure-sensitive adhesive (PSA).

Figure 4A:
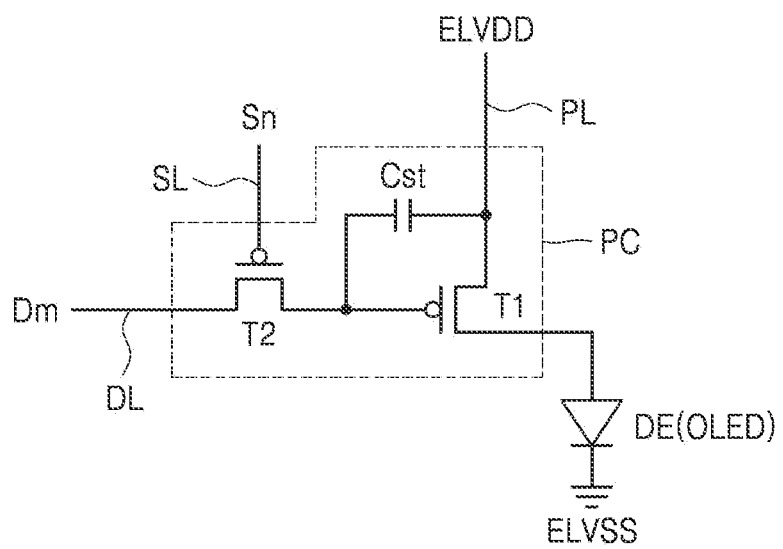
FIGS. 4A and 4B are equivalent circuit diagrams schematically showing a pixel circuit applicable to a display apparatus according to one or more embodiments.
Figure 4B:
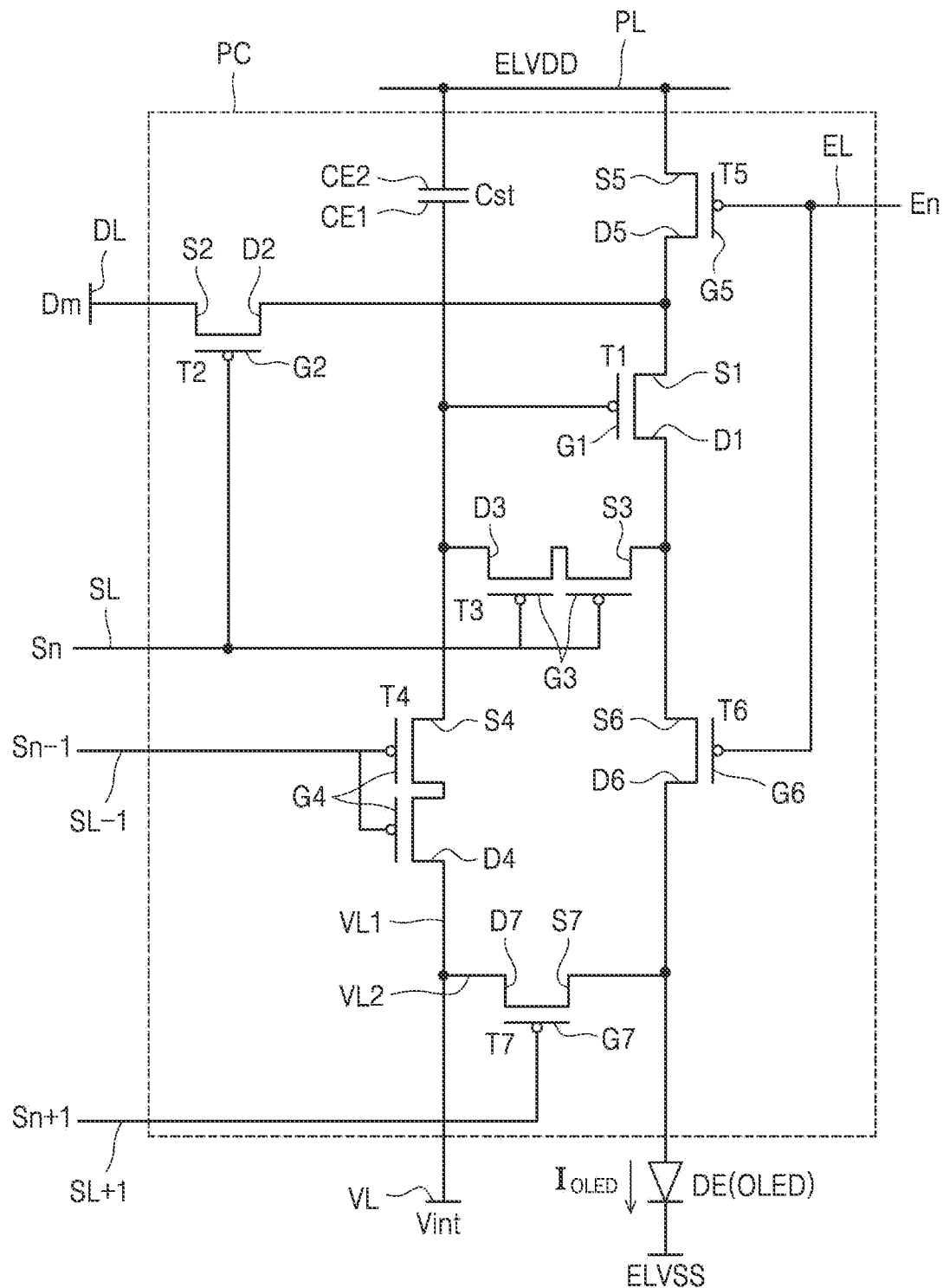

FIGS. 4A and 4B are equivalent circuit diagrams schematically showing the pixel circuit PC applicable to a display apparatus according to one or more embodiments.

Referring to FIG. 4A, the pixel circuit PC may be connected to the scan line SL, the data line DL, and a display element DE. The display element DE may be an organic light-emitting diode OLED.

The pixel circuit PC may include a driving thin-film transistor T1, a scan thin-film transistor T2, and the storage capacitor Cst. The scan thin-film transistor T2 may be connected to the scan line SL and the data line DL, and may be configured to transfer a data voltage Dm input through the data line DL to the driving thin-film transistor T1 according to a scan signal Sn input through the scan line SL.

The storage capacitor Cst may be connected to the scan thin-film transistor T2 and a driving voltage line PL, and may store a voltage corresponding to a difference between a voltage received from the scan thin-film transistor T2 and a driving voltage ELVDD supplied to the driving voltage line PL.

The driving thin-film transistor T1 may be connected to the driving voltage line PL and the storage capacitor Cst, and may be configured to control a driving current flowing through the organic light-emitting diode OLED from the driving voltage line PL, in response to a voltage value stored in the storage capacitor Cst. The organic light-emitting diode OLED may emit light having a desired brightness (e.g., a certain or predetermined brightness) according to the driving current.

Although FIG. 4A shows a case where the pixel circuit PC includes two thin-film transistors and one storage capacitor, the present disclosure is not limited thereto. For example, the pixel circuit PC may include three or more thin-film transistors and/or two or more storage capacitors. In an embodiment, the pixel circuit PC may include seven thin-film transistors and one storage capacitor.

Referring to FIG. 4B, the pixel circuit PC may be connected to the scan line SL, the data line DL, and the display element DE. The display element DE may be the organic light-emitting diode OLED.

As shown in FIG. 4B, as an example, the pixel circuit PC includes first to seventh thin-film transistors T1 to T7, and the storage capacitor Cst. The first to seventh thin-film transistors T1 to T7 and the storage capacitor Cst are connected to first to third scan lines SL, SL−1, and SL+1 configured to transmit first to third scan signals Sn, Sn−1, and Sn+1, respectively, the data line DL configured to transfer the data voltage Dm, the emission control line EL configured to transmit an emission control signal En, the driving voltage line PL configured to transfer the driving voltage ELVDD, an initialization voltage line VL configured to transfer an initialization voltage Vint, and a common electrode to which a common voltage ELVSS is applied.

The first thin-film transistor T1 may be a driving transistor in which the magnitude of a drain current is determined according to a gate-source voltage thereof. The second to seventh thin-film transistors T2 to T7 may be switching transistors that are turned on/off according to the gate-source voltage thereof, or substantially, a gate voltage thereof.

The first thin-film transistor T1 may be referred to as a driving thin-film transistor, the second thin-film transistor T2 may be referred to as a scan thin-film transistor, the third thin-film transistor T3 may be referred to as a compensation thin-film transistor, the fourth thin-film transistor T4 may be referred to as a gate initialization thin-film transistor, the fifth thin-film transistor T5 may be referred to as a first emission control thin-film transistor, the sixth thin-film transistor T6 may be referred to as a second emission control thin-film transistor, and the seventh thin-film transistor T7 may be referred to as an anode initialization thin-film transistor.

The storage capacitor Cst is connected between the driving voltage line PL and a driving gate G1 of the driving thin-film transistor T1. The storage capacitor Cst may include the upper electrode CE2 connected to the driving voltage line PL, and the lower electrode CE1 connected to the driving gate G1 of the driving thin-film transistor T1.

The driving thin-film transistor T1 may be configured to control the magnitude of a driving current $I_{OLED}$ flowing from the driving voltage line PL to the organic light-emitting diode OLED according to the gate-source voltage thereof. The driving thin-film transistor T1 may include the driving gate G1 connected to the lower electrode CE1 of the storage capacitor Cst, a driving source S1 connected to the driving voltage line PL through the first emission control thin-film transistor T5, and a driving drain D1 connected to the organic light-emitting diode OLED through the second emission control thin-film transistor T6.

The driving thin-film transistor T1 may be configured to output the driving current $I_{OLED}$ to the organic light-emitting diode OLED according to the gate-source voltage thereof. The magnitude of the driving current $I_{OLED}$ is determined based on a difference between the gate-source voltage and a threshold voltage of the driving thin-film transistor T1. The organic light-emitting diode OLED may receive the driving current $I_{OLED}$ from the driving thin-film transistor T1, and may emit light having a desired brightness based on the magnitude of the driving current $I_{OLED}$.

The scan thin-film transistor T2 is configured to transfer the data voltage Dm to the driving source S1 of the driving thin-film transistor T1 in response to the first scan signal Sn. The scan thin-film transistor T2 may include a scan gate G2 connected to the first scan line SL, a scan source S2 connected to the data line DL, and a scan drain D2 connected to the driving source S1 of the driving thin-film transistor T1.

The compensation thin-film transistor T3 is serially connected between the driving drain D1 and the driving gate G1 of the driving thin-film transistor T1, and is configured to connect the driving drain D1 and the driving gate G1 of the driving thin-film transistor T1 to each other in response to the first scan signal Sn. The compensation thin-film transistor T3 may include a compensation gate G3 connected to the first scan line SL, a compensation source S3 connected to the driving drain D1 of the driving thin-film transistor T1, and a compensation drain D3 connected to the driving gate G1 of the driving thin-film transistor T1. Although the compensation thin-film transistor T3 includes two thin-film transistors that are serially connected to each other in FIG. 4B, in other embodiments, the compensation thin-film transistor T3 may include one thin-film transistor.

The gate initialization thin-film transistor T4 is configured to apply the initialization voltage Vint to the driving gate G1 of the driving thin-film transistor T1 in response to the second scan signal Sn−1. The gate initialization thin-film transistor T4 may include a first initialization gate G4 connected to the second scan line SL−1, a first initialization source S4 connected to the driving gate G1 of the driving thin-film transistor T1, and a first initialization drain D4 connected to the initialization voltage line VL. Although the gate initialization thin-film transistor T4 includes two thin-film transistors that are serially connected to each other in FIG. 4B, in other embodiments, the gate initialization thin-film transistor T4 may include one thin-film transistor.

The anode initialization thin-film transistor T7 is configured to apply the initialization voltage Vint to an anode of the organic light-emitting diode OLED in response to the third scan signal Sn+1. The anode initialization thin-film transistor T7 may include a second initialization gate G7 connected to the third scan line SL+1, a second initialization source S7 connected to the anode of the organic light-emitting diode OLED, and a second initialization drain D7 connected to the initialization voltage line VL.

The first emission control thin-film transistor T5 may be configured to connect the driving voltage line PL to the driving source S1 of the driving thin-film transistor T1 in response to the emission control signal En. The first emission control thin-film transistor T5 may include a first emission control gate G5 connected to the emission control line EL, a first emission control source S5 connected to the driving voltage line PL, and a first emission control drain D5 connected to the driving source S1 of the driving thin-film transistor T1.

The second emission control thin-film transistor T6 may be configured to connect the driving drain D1 of the driving thin-film transistor T1 to the anode of the organic light-emitting diode OLED in response to the emission control signal En. The second emission control thin-film transistor T6 may include a second emission control gate G6 connected to the emission control line EL, a second emission control source S6 connected to the driving drain D1 of the driving thin-film transistor T1, and a second emission control drain D6 connected to the anode of the organic light-emitting diode OLED.

The second scan signal Sn−1 may be synchronized or substantially synchronized with the first scan signal Sn of a previous row. The third scan signal Sn+1 may be synchronized or substantially synchronized with the first scan signal Sn. According to another embodiment, the third scan signal Sn+1 may be synchronized or substantially synchronized with the first scan signal Sn of a subsequent row (e.g., a next row).

In the present embodiment, the first to seventh thin-film transistors T1 to T7 may each include a semiconductor layer including silicon. As an example, the first to seventh thin-film transistors T1 to T7 may each include a semiconductor layer including low temperature poly-silicon (LTPS). The polysilicon material has high electron mobility (e.g., 100 cm$^2$/Vs or greater), low energy consumption, and excellent reliability. As another example, semiconductor layers of the first to seventh thin-film transistors T1 to T7 may include an oxide of at least one material selected from the group including indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn). For example, the semiconductor layer may be an InSnZnO (ITZO) semiconductor layer, an InGaZnO (IGZO) semiconductor layer, or the like. As another example, some of the semiconductor layers of the first to seventh thin-film transistors T1 to T7 may include LTPS, and others of the semiconductor layers may include an oxide semiconductor (e.g., IGZO).

Figure 5:
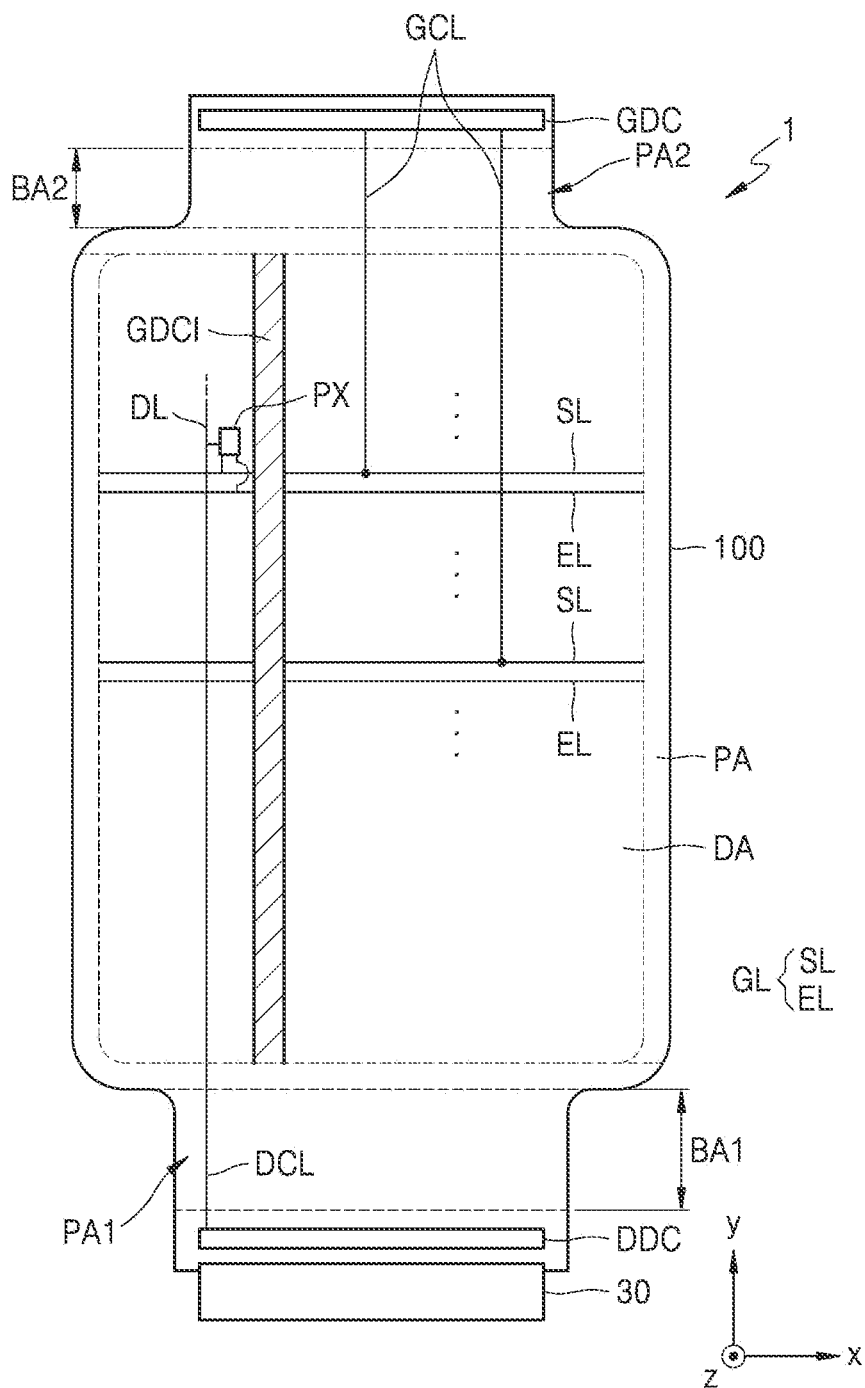
FIG. 5 is a schematic plan view of a display apparatus according to an embodiment.

FIG. 5 is a schematic plan view of the display apparatus 1 according to an embodiment. In FIG. 5, the same reference symbols as those described above with reference to FIG. 2 denote the same or substantially the same elements, and thus, redundant description thereof may not be repeated.

Referring to FIG. 5, the display apparatus 1 may include the display area DA and the peripheral area PA. The gate driving circuit GDC and the data driving circuit DDC may be arranged in the peripheral area PA.

The data driving circuit DDC may be arranged in the first peripheral area PA1, and the gate driving circuit GDC may be arranged in the second peripheral area PA2. The first peripheral area PA1 and the second peripheral area PA2 may be areas positioned opposite to (e.g., to face) each other with the display area DA therebetween.

The data driving circuit DDC may be configured to provide a data signal to each pixel PX through the corresponding data line DL. The data line DL may be connected to the data driving circuit DDC through the data connection line DCL.

The gate driving circuit GDC may be configured to transmit a gate signal to each pixel PX through the corresponding gate line GL. The gate line GL may be connected to the gate driving circuit GDC through the gate connection line GCL. The gate driving circuit GDC may include a scan driving circuit and/or an emission control driving circuit. The gate line GL may include the scan line SL and/or the emission control line EL, and the gate signal may include a scan signal and/or an emission control signal.

An internal gate driving circuits GDCI may be arranged in the display area DA. The internal gate driving circuit GDCI may overlap with an emission area of a display element. The internal gate driving circuit GDCI may be arranged to extend in the second direction (e.g., the y direction). The internal gate driving circuit GDCI may be a scan driving circuit or an emission control driving circuit.

The scan line SL and/or the emission control line EL may extend by bypassing each internal gate driving circuit GDCI. For example, the scan line SL and/or the emission control line EL may cross between adjacent internal gate driving circuits and extend in a first direction (e.g., a direction x). In this case, interference between the wires and the circuit may be prevented or substantially prevented. However, the present disclosure is not limited thereto, and the scan line SL and/or the emission control line EL may overlap with the internal gate driving circuit GDCI.

In an embodiment, when the internal gate driving circuit GDCI is the emission control driving circuit, the gate driving circuit GDC arranged in the second peripheral area PA2 may be (e.g., may refer to) the scan driving circuit. In other words, one of the scan driving circuit and/or the emission control driving circuit may be arranged in the second peripheral area PA2, and the other one may be arranged in the display area DA. In the case where the internal gate driving circuit GDCI is the emission control driving circuit, and the gate driving circuit GDC arranged in the second peripheral area PA2 is the scan driving circuit, as shown in FIG. 5, the gate connection line GCL may connect the gate driving circuit GDC to the scan line SL, and the emission control line EL may be connected to the internal gate driving circuit GDCI.

In an embodiment, when the internal gate driving circuit GDCI is the scan driving circuit, the gate driving circuit GDC arranged in the second peripheral area PA2 may be (e.g., may refer to) the emission control driving circuit. In this case, the gate connection line GCL may connect the gate driving circuit GDC to the emission control line EL, and the scan line SL may be connected to the internal gate driving circuit GDCI.

In an embodiment, from among the scan driving circuit and the emission control driving circuit, a circuit that may be arranged at a smaller width may be selected and arranged in the display area DA. In other words, a width in the first direction (e.g., the x direction) of the internal gate driving circuit GDCI arranged in the display area DA may be less than a width in the second direction (e.g., the y direction) of the gate driving circuit GDC arranged in the second peripheral area PA2.

According to an embodiment, the data driving circuit DDC may be arranged in the first peripheral area PA1, the gate driving circuit GDC may be arranged in the second peripheral area PA2, and the internal gate driving circuit GDCI may be arranged in the display area DA. Because at least one of the driving circuits are arranged as the internal gate driving circuit GDCI in the display area DA, the area of the second peripheral area PA2 may be reduced without reducing the area of the display area DA. In addition, a concentration of wires in the second peripheral area PA2 may be prevented or substantially prevented.

Figure 6A:
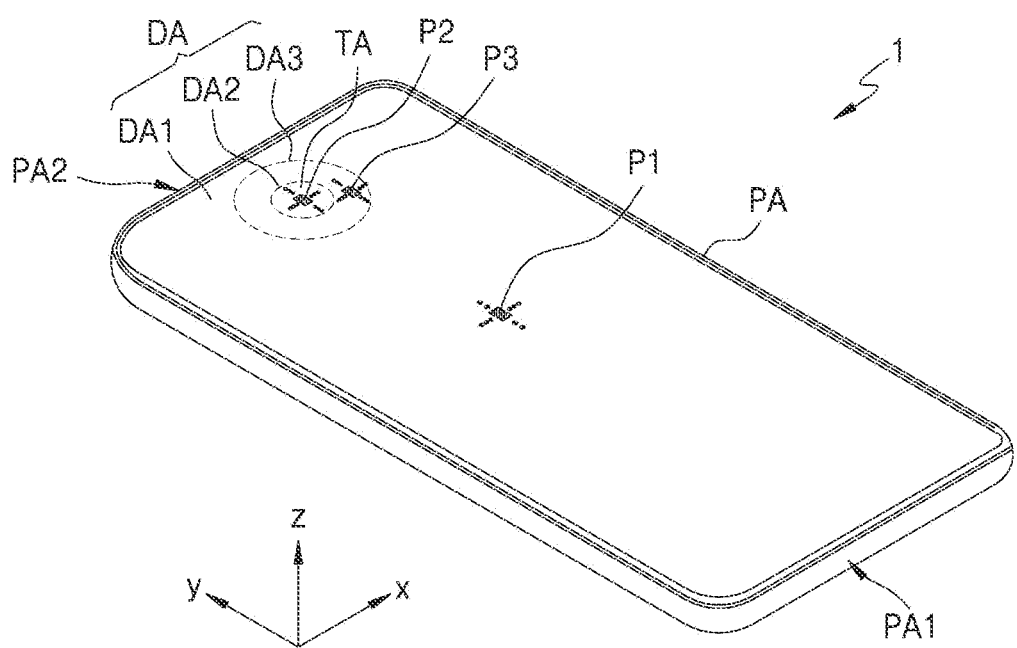
FIG. 6A is a schematic perspective view of a display apparatus according to an embodiment.
Figure 6B:
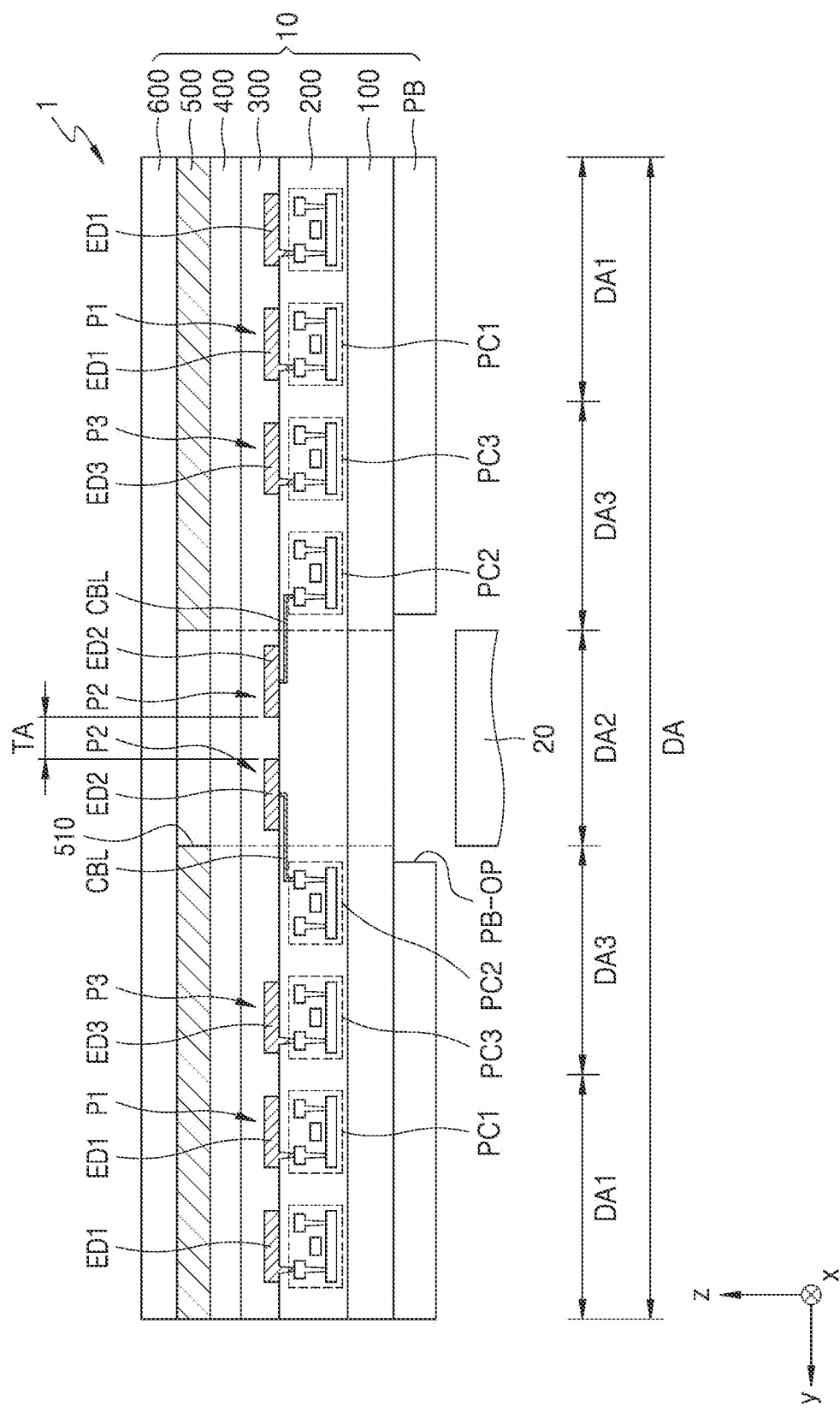
FIG. 6B is a schematic cross-sectional view of a display apparatus according to an embodiment.
Figure 6C:
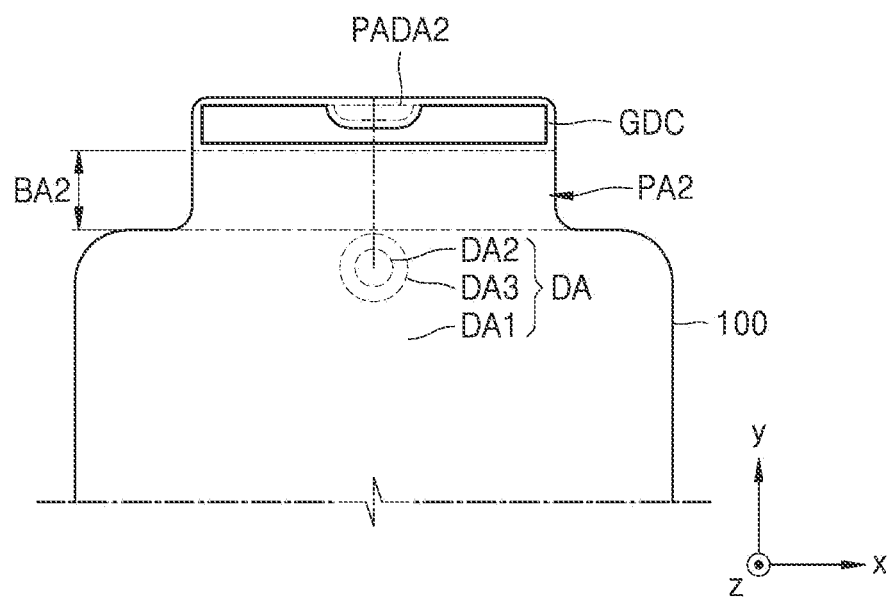
FIG. 6C is a schematic plan view of a portion of a display apparatus according to an embodiment.
Figure 6D:
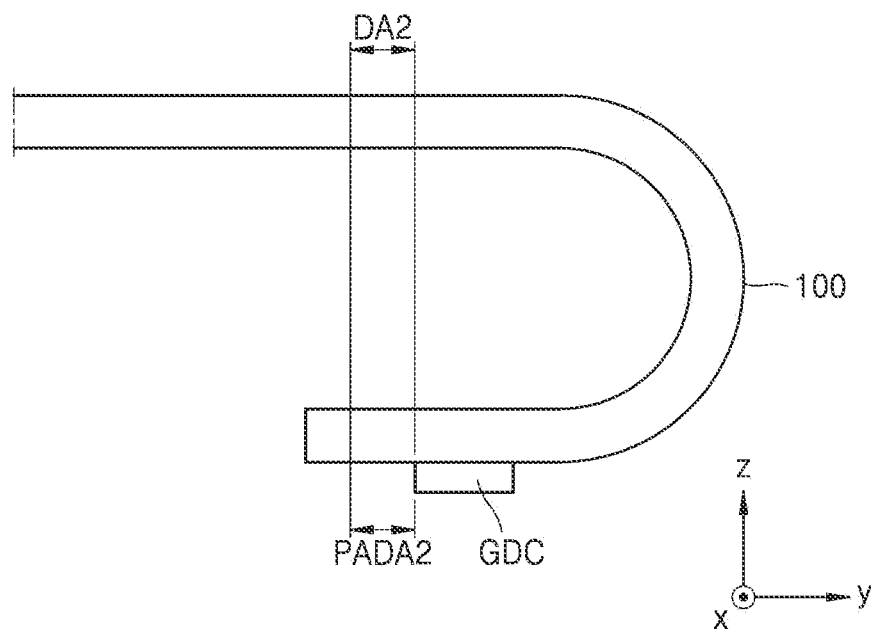
FIG. 6D is a schematic side view of a portion of a display apparatus according to an embodiment.

FIG. 6A is a schematic perspective view of the display apparatus 1 according to an embodiment. FIG. 6B is a schematic cross-sectional view of the display apparatus 1 according to an embodiment. FIG. 6C is a schematic plan view of a portion of a display apparatus according to an embodiment. FIG. 6D is a schematic cross-sectional view of a portion of a display apparatus according to an embodiment. In FIGS. 6A through 6D, the same reference symbols as those described above with reference to FIGS. 1 to 5 denote the same or substantially the same elements, and thus, redundant description thereof may not be repeated.

Referring to FIG. 6A, the display apparatus 1 may include the display area DA, and the peripheral area PA located outside the display area DA. The display area DA may display an image through sub-pixels. The peripheral area PA is a non-display area that is arranged outside the display area DA, and does not display an image. The peripheral area PA may entirely surround (e.g., around a periphery of) the display area DA.

The display area DA may include a first display area DA1 occupying most of the display area DA, and a second display area DA2 corresponding to a component described in more detail below with reference to FIG. 6B. The first display area DA1 may occupy most of the area of the display area DA. Occupying most of the area may indicate that the area of the first display area DA1 is about 50% or greater of the area of the display area DA.

The second display area DA2 may be arranged inside (e.g., within) the first display area DA1, and may be entirely surrounded (e.g., around a periphery thereof) by the first display area DA1. The display area DA may include a third display area DA3 between the first display area DA1 and the second display area DA2. The third display area DA3 may surround (e.g., around a periphery of) the second display area DA2, and the first display area DA1 may surround (e.g., around a periphery of) the third display area DA3.

The display area DA may display an image by using sub-pixels that are arranged two-dimensionally. From among the sub-pixels arranged in the display area DA, the sub-pixels that are arranged in the first display area DA1 are referred to as first sub-pixels P1, the sub-pixels that are arranged in the second display area DA2 are referred to as second sub-pixels P2, and the sub-pixels that are arranged in the third display area DA3 are referred to as third sub-pixels P3.

The second display area DA2 and the third display area DA3 may each have a smaller area than that of the first display area DA1. FIG. 6A shows the second display area DA2 and the third display area DA3 each having a circular shape. However, in another embodiment, the second display area DA2 and the third display area DA3 may each have a quadrangular or substantially quadrangular shape.

Although FIG. 6A shows that the second display area DA2 and the third display area DA3 are arranged at the center of an upper side (e.g., in the direction +y) of the display area DA having a rectangular or substantially quadrangular shape when viewed in a direction perpendicular to or substantially perpendicular to an upper surface of the display apparatus 1 (e.g., in a plan view), the present disclosure is not limited thereto. The second display area DA2 and the third display area DA3 may be, for example, arranged at an upper right side or an upper left side of the display area DA.

The second display area DA2 may implement an image through the second sub-pixels P2, and may transmit light and/or sound through an area between the second sub-pixels P2. Hereinafter, an area through which light and/or sound may pass is referred to as a transmission area TA. In other words, the second display area DA2 may include the transmission area TA between the second sub-pixels P2.

FIG. 6B is a schematic cross-sectional view of the display apparatus 1 according to an embodiment.

Referring to FIG. 6B, the display apparatus 1 may include a display panel 10, and a component 20 overlapping with the display panel 10. The component 20 may be arranged in the second display area DA2.

The component 20 may be an electronic element that uses light or sound. For example, the electronic element may be a sensor that measures a distance, such as a proximity sensor, a sensor that recognizes a part of a user's body (e.g., a fingerprint, an iris, a face, and/or the like), a small lamp that outputs light, or an image sensor (e.g., a camera) that captures an image. An electronic element that uses light may use light in various suitable wavelength bands, for example, such as visible light, infrared light, ultraviolet light, and/or the like. An electronic element that uses sound may use ultrasound or sound in other suitable frequency bands.

The second display area DA2 may include the transmission area TA through which light and/or sound that is output from the component 40 to the outside or travels toward the component 40 from the outside may pass. In an embodiment, the transmission area TA is an area through which light may pass, and may correspond to an area between the second sub-pixels P2. In the display apparatus 1 according to an embodiment, when light is allowed to pass through the second display area DA2 including the transmission area TA, light transmittance thereof may be 10% or greater, and in more detail, 25% or greater, 40% or greater, 50% or greater, 85% or greater, or 90% or greater.

Each of the first sub-pixel P1, the second sub-pixel P2, and the third sub-pixel P3 described above with reference to FIG. 6A may emit light by using a light-emitting diode, and each light-emitting diode may be arranged in the display area DA of the display panel 10. In this regard, a light-emitting diode that corresponds to the first sub-pixel P1 and is arranged in the first display area DA1 is referred to as a first light-emitting diode ED1, a light-emitting diode that corresponds to the second sub-pixel P2 and is arranged in the second display area DA2 is referred to as a second light-emitting diode ED2, and a light-emitting diode that corresponds to the third sub-pixel P3 and is arranged in the third display area DA3 is referred to as a third light-emitting diode ED3. The first to third light-emitting diodes ED1, ED2, and ED3 may be disposed above the substrate 100.

A protection film PB may be disposed on a bottom surface of the substrate 100. The protection film PB may include an opening PB-OP in the second display area DA2 to improve a transmittance of the transmission area TA. The pixel circuit layer 200 may include a first sub-pixel circuit PC1, a second sub-pixel circuit PC2, and a third sub-pixel circuit PC3.

The first light-emitting diode ED1 is arranged in the first display area DA1, and is electrically connected to the first sub-pixel circuit PC1 arranged in the first display area DA1. The first sub-pixel circuit PC1 may include transistors, and a storage capacitor electrically connected to the transistors.

The second light-emitting diode ED2 is arranged in the second display area DA2. The second light-emitting diode ED2 is electrically connected to the second sub-pixel circuit PC2. The second sub-pixel circuit PC2 is not arranged in the second display area DA2 to improve a transmittance and a transmission area of the transmission area TA included in the second display area DA2. The second sub-pixel circuit PC2 is arranged in the third display area DA3, and the second light-emitting diode ED2 may be electrically connected to the second sub-pixel circuit PC2 through a conductive bus line CBL.

The conductive bus line CBL may electrically connect the second sub-pixel circuit PC2 in the third display area DA3 to the second light-emitting diode ED2 in the second display area DA2. The conductive bus line CBL may include a light-transmitting conductive material, for example, such as a transparent conductive oxide (TCO). The transparent conductive oxide (TCO) may include indium tin oxide (ITO), indium zinc oxide (IZO), zinc oxide (ZnO), indium oxide (In$_2$O$_3$), indium gallium oxide (IGO), and/or aluminum zinc oxide (AZO).

The third light-emitting diode ED3 is arranged in the third display area DA3, and is electrically connected to the third sub-pixel circuit PC3 arranged in the third display area DA3. The third sub-pixel circuit PC3 may include transistors, and a storage capacitor electrically connected to the transistors.

Each of the first to third light-emitting diodes ED1, ED2, and ED3 is a light-emitting element for emitting light of a desired color (e.g., a certain or predetermined color), and may include an organic light-emitting diode.

The first to third light-emitting diodes ED1, ED2, and ED3 may be covered by an encapsulation layer 300. The encapsulation layer 300 may be a thin-film encapsulation layer including an inorganic encapsulation layer and an organic encapsulation layer. The inorganic encapsulation layer includes an inorganic insulating material, and the organic encapsulation layer includes an organic insulating material. The encapsulation layer 300 may be an encapsulation substrate including glass. A sealant including frit may be disposed between the substrate 100 and the encapsulation substrate. The sealant may be in the peripheral area PA, and may extend to surround (e.g., around a periphery of) the outer edge of the display area DA, thereby preventing or substantially preventing moisture from penetrating toward the first to third light-emitting diodes ED1, ED2, and ED3 through side surfaces of the display panel 10.

An input sensing layer 400 may be disposed on the encapsulation layer 300. The input sensing layer 400 may obtain coordinate information according to an external input, for example, such as a touch event by an object (e.g., a finger or a stylus pen). The input sensing layer 400 may include a touch electrode, and trace lines connected to the touch electrode. The input sensing layer 400 may sense an external input by using a mutual capacitance method or a self-capacitance method.

An optical functional layer 500 may include an anti-reflection layer. The anti-reflection layer may reduce a reflectance of light (e.g., external light) that is externally incident toward the display panel 10 through a cover window 600. The anti-reflection layer may include a phase retarder and a polarizer. When the optical functional layer 500 includes a polarizer, the optical functional layer 500 may include an opening 510 in the second display area DA2, and thus, may improve a transmittance of the transmission area TA.

In another embodiment, the anti-reflection layer may include a black matrix and color filters. The color filters may be arranged by taking into account the colors of light emitted from the first to third light-emitting diodes ED1, ED2, and ED3, respectively. When the optical functional layer 500 includes a black matrix and color filters, a light-transmitting material may be arranged at a position corresponding to the transmission area TA.

In another embodiment, the anti-reflection layer may include a destructive interference structure. The destructive interference structure may include a first reflection layer and a second reflection layer arranged at (e.g., in or on) different layers from each other. First reflected light and second reflected light reflected by the first reflection layer and the second reflection layer, respectively, may destructively interfere with each other, and thus, the reflectance of the external light may be reduced.

The cover window 600 may be disposed on the optical functional layer 500. The cover window 600 may be coupled to the optical functional layer 500 through an adhesive layer, such as an optically clear adhesive disposed therebetween. The cover window 600 may include a glass material and/or a plastic material. The plastic material may include polyethersulfone, polyacrylate, polyetherimide, polyethylene naphthalate, polyethylene terephthalate, polyphenylene sulfide, polyarylate, polyimide, polycarbonate, or cellulose acetate propionate.

The cover window 600 may include a flexible cover window. For example, the cover window 600 may include polyimide and/or ultra-thin glass.

FIG. 6C is a plan view showing the shape of the second bending area BA2 of the display apparatus 1 that is not yet bent. FIG. 6D is a schematic cross-sectional view of the shape of the second bending area BA2 in a bent state.

Referring to FIGS. 6C and 6D, the gate driving circuit GDC arranged in the second peripheral area PA2 may at least partially surround (e.g., around a periphery of) a certain area in the second peripheral area PA2. As another example, the gate driving circuit GDC may be arranged to avoid a certain area in the second peripheral area PA2.

The certain area may be an area PADA2 corresponding to the second display area DA2. In more detail, the area PADA2 may be an area that corresponds to the second display area DA2 in which the component 20 (e.g., refer to FIG. 6B) is arranged when viewed in a direction perpendicular to the substrate 100 (e.g., the z direction). The corresponding area PADA2 may be an area that overlaps with the second display area DA2 when viewed in the direction perpendicular to the substrate 100 (e.g., the z direction).

In an embodiment, when an area where the gate driving circuit GDC arranged in the second peripheral area PA2 overlapping with the component 20 is reduced or removed, interference between the gate driving circuit GDC and the component 20 may be prevented or substantially prevented during bending.

Figure 7:
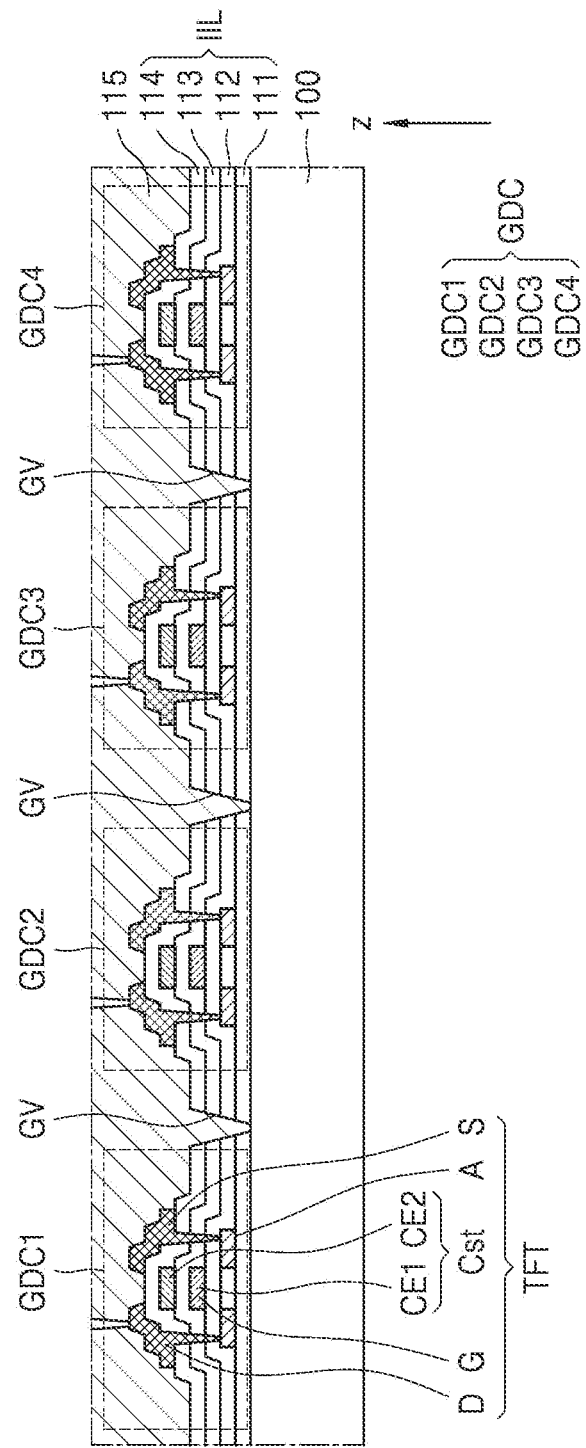
FIG. 7 is a schematic cross-sectional view of a display apparatus according to an embodiment.

FIG. 7 is a schematic cross-sectional view of a display apparatus according to an embodiment. In FIG. 7, the same reference symbols as those described above with reference to FIG. 3B denote the same or substantially the same elements, and thus, redundant description thereof may not be repeated.

Referring to FIG. 7, the gate driving circuit GDC may include a thin-film transistor TFT and a storage capacitor Cst, and the thin-film transistor TFT may include a semiconductor layer A, a gate electrode G, a source electrode S, and a drain electrode D. The inorganic insulating layer IIL disposed on the substrate 100 may include the buffer layer 111, the first gate insulating layer 112, the second gate insulating layer 113, and the interlayer insulating layer 114.

The inorganic insulating layer IIL may include a groove GV. The groove GV may be in the shape of a trench, and may have the shape in which a portion of the inorganic insulating layer IIL is removed. For example, the groove GV may have a shape in which an opening in the buffer layer 111, an opening in the first gate insulating layer 112, an opening in the second gate insulating layer 113, and an opening in the interlayer insulating layer 114 overlap with one another in the third direction (e.g., the z direction). Although FIG. 7 shows the groove GV that is deep enough to expose an upper surface of the substrate 100, the present disclosure is not limited thereto, and the groove GV may have various suitable depths. For example, the groove GV may be deep enough to expose an upper surface of the buffer layer 111.

The gate driving circuit GDC may include a first gate driving circuit GDC1, a second gate driving circuit GDC2, a third gate driving circuit GDC3, and a fourth gate driving circuit GDC4. The first gate driving circuit GDC1, the second gate driving circuit GDC2, the third gate driving circuit GDC3, and the fourth gate driving circuit GDC4 may be circuits configured to transmit different signals, respectively, to a pixel. For example, referring to FIG. 4B and FIG. 7 together, the first gate driving circuit GDC1 may be a circuit configured to transmit the first scan signal Sn, the second gate driving circuit GDC2 may be a circuit configured to transmit the second scan signal Sn−1, the third gate driving circuit GDC3 may be a circuit configured to transmit the third scan signal Sn+1, and the fourth gate driving circuit GDC4 may be a circuit configured to transmit the emission control signal En.

The groove GV may surround (e.g., around the periphery of) each gate driving circuit GDC. The groove GV may be defined along the edge of one gate driving circuit GDC. As another example, the groove GV may surround (e.g., around a periphery of) a certain gate driving circuit GDC adjacent thereto. In a plan view (e.g., in the z direction), the groove GV may have a quadrangular or substantially quadrangular shape.

The groove GV may be between adjacent gate driving circuits GDC. As shown in FIG. 7, the groove GV may be between the first gate driving circuit GDC1 and the second gate driving circuit GDC2, between the second gate driving circuit GDC2 and the third gate driving circuit GDC3, and between the third gate driving circuit GDC3 and the fourth gate driving circuit GDC4.

The first planarization layer 115 may fill (e.g., may be buried in) the groove GV. The first planarization layer 115 may be an organic insulating layer. Because the first planarization layer 115 filled in the groove GV formed in the inorganic insulating layer IIL includes an organic material, a crack formed in the inorganic insulating layer IIL in a pixel due to external impacts may be prevented or reduced from propagating or growing into an adjacent pixel. In more detail, the display apparatus 1 may be resistant to impacts that may occur during a process of bending the second bending area BA2 adjacent to the gate driving circuit GDC.

The above described groove GV may apply to the data driving circuit DDC, as well as the gate driving circuit GDC. For example, the groove GV may be arranged between adjacent data driving circuits DDC, and an organic insulating layer may fill (e.g., may be buried in) the groove GV. Thus, the display apparatus 1 may be resistant to impacts that may occur during bending of the first bending area BA1.

While a display apparatus has been mainly described, the present disclosure is not limited thereto. For example, it will be understood that a method of manufacturing a display panel and a method of manufacturing a display apparatus as described above also fall within the scope of the present disclosure.

According to one or more embodiments, an apparatus having an extended display area may be implemented. However, the present disclosure is not limited to such aspects and features.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
   a substrate comprising:
      a display area; and
      a peripheral area comprising:
         a first peripheral area comprising a first bending area; and
         a second peripheral area comprising a second bending area;
   a pixel in the display area and comprising a display element;
   a data driving circuit in the first peripheral area;
   a gate driving circuit in the second peripheral area;
   a data line electrically connected to the data driving circuit and the pixel;
   a gate line electrically connected to the gate driving circuit and the pixel; and
   a gate connection line having one side connected to the gate driving circuit, and another side connected to the gate line,
   wherein the first peripheral area and the second peripheral area are opposite to each other with the display area therebetween, and
   wherein the display apparatus further comprises an internal gate driving circuit in the display area.

2. The display apparatus of claim 1, wherein the gate connection line overlaps with the display area.

3. The display apparatus of claim 1, further comprising a display circuit board attached to the first peripheral area or the second peripheral area.

4. The display apparatus of claim 1, wherein the gate line extends in a first direction, and the data line and the gate connection line extend in a second direction crossing the first direction.

5. The display apparatus of claim 1, wherein the first bending area is between the display area and the data driving circuit, and
   wherein the second bending area is between the display area and the gate driving circuit.

6. The display apparatus of claim 1, wherein the internal gate driving circuit is configured to transmit an emission control signal to the pixel.

7. The display apparatus of claim 1, further comprising:
   a first insulating layer in the first peripheral area of the substrate, and comprising a groove surrounding the data driving circuit; and
   a second insulating layer having at least a portion filled in the groove.

8. The display apparatus of claim 1, further comprising:
   a first insulating layer in the second peripheral area of the substrate, and comprising a groove surrounding the gate driving circuit; and
   a second insulating layer having at least a portion filled in the groove.

9. The display apparatus of claim 1, wherein the display area comprises a first display area, and a second display area at least partially surrounded by the first display area, and
wherein the gate driving circuit at least partially surrounds a portion of the second peripheral area that overlaps with the second display area in a plan view.

10. A display apparatus comprising:
a substrate comprising:
a display area; and
a peripheral area comprising:
a first peripheral area comprising a first bending area; and
a second peripheral area opposite to the first peripheral area with the display area between the first peripheral area and the second peripheral area;
a pixel in the display area and comprising a display element;
a data driving circuit in the first peripheral area;
a gate driving circuit in the second peripheral area;
a gate line electrically connected to the gate driving circuit, and extending in a first direction to be connected to the pixel; and
a data line electrically connected to the data driving circuit, and extending in a second direction crossing the first direction to be connected to the pixel, and
wherein the display apparatus further comprises an internal gate driving circuit in the display area and extending in the second direction.

11. The display apparatus of claim 10, wherein the second peripheral area comprises a second bending area facing the first bending area in the second direction.

12. The display apparatus of claim 11, wherein the first bending area is between the display area and the data driving circuit, and
wherein the second bending area is between the display area and the gate driving circuit.

13. The display apparatus of claim 10, further comprising a gate connection line extending in the second direction, the gate connection line having one side connected to the gate driving circuit, and another side connected to the gate line.

14. The display apparatus of claim 10, further comprising a display circuit board attached to the first peripheral area or the second peripheral area.

15. The display apparatus of claim 10, further comprising a first insulating layer on the substrate, and comprising a groove surrounding the gate driving circuit or the data driving circuit.

16. The display apparatus of claim 15, further comprising a second insulating layer having at least a portion filled in the groove.

17. The display apparatus of claim 10, wherein the display area comprises a first display area, and a second display area at least partially surrounded by the first display area, and
wherein the display apparatus further comprises a component under the substrate to correspond to the second display area.

18. The display apparatus of claim 17, wherein the gate driving circuit at least partially surrounds a portion of the second peripheral area corresponding to the component in a plan view.

* * * * *